United States Patent
Otagaki et al.

(10) Patent No.: US 9,798,423 B2
(45) Date of Patent: Oct. 24, 2017

(54) TOUCH SENSOR

(71) Applicant: Semiconductor Components Industries, LLC, Phoenix, AZ (US)

(72) Inventors: Takayasu Otagaki, Gifu-ken (JP); Hiroya Ito, Aichi-ken (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 13/851,583

(22) Filed: Mar. 27, 2013

(65) Prior Publication Data

US 2013/0257801 A1 Oct. 3, 2013

(30) Foreign Application Priority Data

Mar. 27, 2012 (JP) ................... 2012-072444

(51) Int. Cl.
*G06F 3/044* (2006.01)
*H03K 17/96* (2006.01)

(52) U.S. Cl.
CPC ......... *G06F 3/044* (2013.01); *H03K 17/9622* (2013.01); *H03K 2217/960765* (2013.01)

(58) Field of Classification Search
CPC ............... G06F 3/044; H03K 17/9622; H03K 2217/960765; H03K 17/962; H03K 2217/960755
USPC ................... 345/174, 173; 178/18.06, 18.05; 29/825–846
See application file for complete search history.

(56) References Cited

U.S. PATENT DOCUMENTS

| | | | |
|---|---|---|---|
| 2008/0053714 A1* | 3/2008 | Ito ........................... | G06F 3/044 178/18.06 |
| 2008/0142352 A1* | 6/2008 | Wright .................... | G06F 3/044 200/600 |
| 2010/0134422 A1* | 6/2010 | Borras ..................... | G06F 3/044 345/173 |
| 2010/0171723 A1 | 7/2010 | Kobayashi et al. | |
| 2012/0032916 A1* | 2/2012 | Enoki ...................... | G06F 3/044 345/174 |
| 2012/0217982 A1* | 8/2012 | Narayanasamy .... | H03K 17/962 324/686 |
| 2013/0141343 A1* | 6/2013 | Yu ........................... | G06F 3/044 345/173 |

FOREIGN PATENT DOCUMENTS

| | | |
|---|---|---|
| JP | 2005-031790 | 2/2005 |
| JP | 2009-026151 | 2/2009 |
| JP | 2010-182290 A | 8/2010 |
| JP | 2011-113893 | 6/2011 |

OTHER PUBLICATIONS

English abstract of Japanese Publication No. 2010-182290 published on Aug. 19, 2010, Espacenet database, 1 page.

* cited by examiner

*Primary Examiner* — Ibrahim Khan
(74) *Attorney, Agent, or Firm* — Rennie William Dover

(57) ABSTRACT

A plurality of detection patterns are formed as conductive patterns directly on a back surface of a panel substrate to which an operation object such as a finger comes in proximity from a front surface side thereof. By independently detecting a change in capacitance in the plurality of detection patterns caused by proximity of the operation object from the front surface side, proximity of the operation object to the panel substrate is detected.

17 Claims, 9 Drawing Sheets

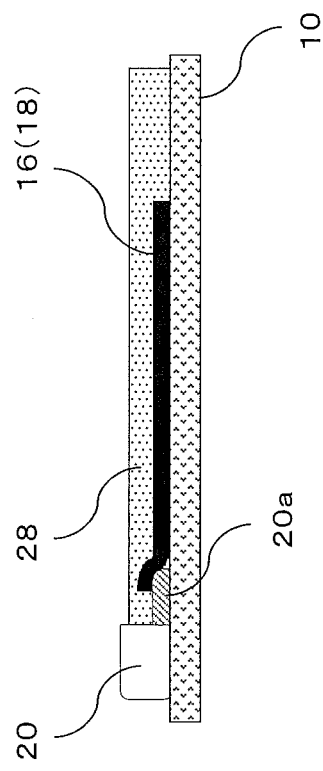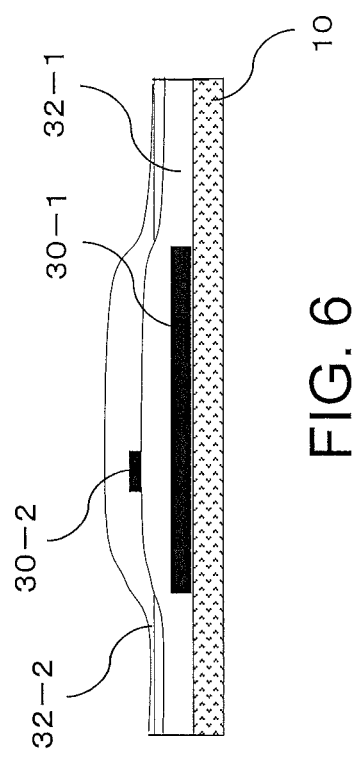

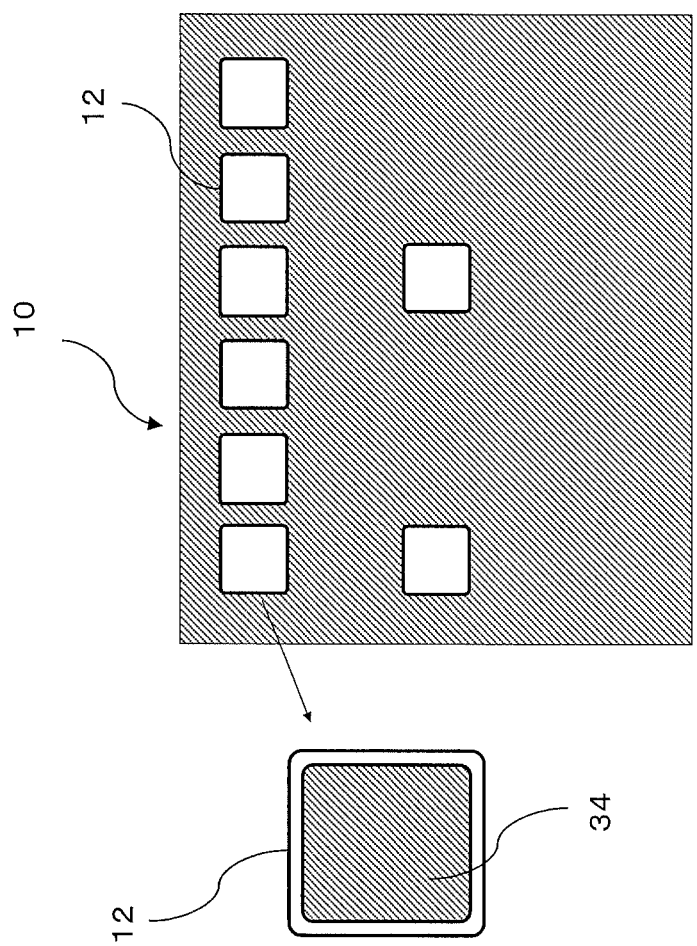

TOUCH SENSOR

PRIORITY INFORMATION

This application claims priority to Japanese Patent Application No. 2012-072444, filed on Mar. 27, 2012, which is incorporated herein by reference in its entirety.

BACKGROUND

Technical Field

The present invention relates to a capacitance-type touch sensor which detects a change in capacitance caused by proximity of a finger and other objects to the touch sensor.

Background Art

Touch sensors have been conventionally diffused widely as an input means for various signals. Among various types of touch sensors, a capacitance-type touch sensor which detects a change in capacitance caused by proximity of a finger to the touch sensor has been becoming mainstream.

Here, in a touch switch in which a touch sensor is employed, it is most common to form detection patterns on a circuit board. The space on the circuit board is suitable for fabrication of IC and other peripheral components, and forming detection patterns on the same circuit board promotes integration and ease of handling.

In such a touch sensor, a circuit board is disposed immediately under a casing (which will be referred to as a cabinet), and a change in capacitance in the detection patterns caused by touch of switch patterns designed on the cabinet with a finger is detected.

As this capacitance-type touch sensor, in addition to touch sensors in which direct-current voltage is applied to the capacitance, alternating current type touch sensors have been also proposed (JP 2010-182290). These alternating-current type touch sensors are advantageous over the direct-current type because of higher sensitivity.

SUMMARY

Technical Problems

In conventional touch sensors, detection patterns are formed on a circuit board which is provided separately from a cabinet. This structure increases the size of the circuit board, which further results in an increase in costs, and also leads to a problem that a design change such as a position change, of the touch sensor requires a design change of the circuit board as a whole. Further, there is another problem of a reduction in the sensitivity as the interval between the cabinet and the circuit board increases. Also, design restrictions are severe, because, in order to form the detection patterns on the circuit board having a planar shape and to make the interval therebetween fixed, the cabinet must also have a planar shape.

In one aspect of the present invention, there is provided a touch sensor including a panel substrate to which an operation object such as a finger comes in proximity from a front surface side, and one or more detection patterns which are directly formed on a back surface of the panel substrate as conductive patterns, each detection pattern detecting a change in capacitance independently from each other. A position of the operation object in proximity to the panel substrate or touch of the operation object with the panel substrate is detected by independently detecting changes of capacitances in the one or more detection patterns caused by the proximity of the operation object to the panel substrate from the front side thereof or the touch of the operation object with the panel substrate.

According to the one aspect of the present invention, a detection pattern for detecting a change in capacitance is formed on the back surface side of the panel substrate. Accordingly, it is possible to improve the detection sensitivity and also increase the degree of freedom in manufacturing the circuit board by allowing the circuit board to be provided independently.

BRIEF DESCRIPTION OF THE DRAWINGS

A preferred embodiment of the present invention will be described in detail based on the following figures, wherein:

FIG. 5 is a view illustrating connections of wiring pattern to a connector;

FIG. 6 is a view illustrating multilayer wiring;

FIG. 7 is a view illustrating a front surface of a cabinet when a metal chassis is used;

DESCRIPTION OF EMBODIMENTS

A preferred embodiment of the present invention will be described in detail with reference to the accompanying drawings. Here, the following embodiment will be described for the illustrative purpose and the present invention is not limited to this embodiment.

The present embodiment relates to a touch switch which externally outputs touch or proximity of a finger with or to a switch pattern, and in this example, relates to a touch panel which externally outputs detection of touch of a finger with a pad pattern or detection of proximity of a finger to a pad pattern. In this example, a cabinet 10 serves as external package (casing) of a touch sensor.

While in the following example, a plurality of detection patterns 14 are provided on the cabinet 10, only a single detection pattern 14 may be provided.

Figure 1:
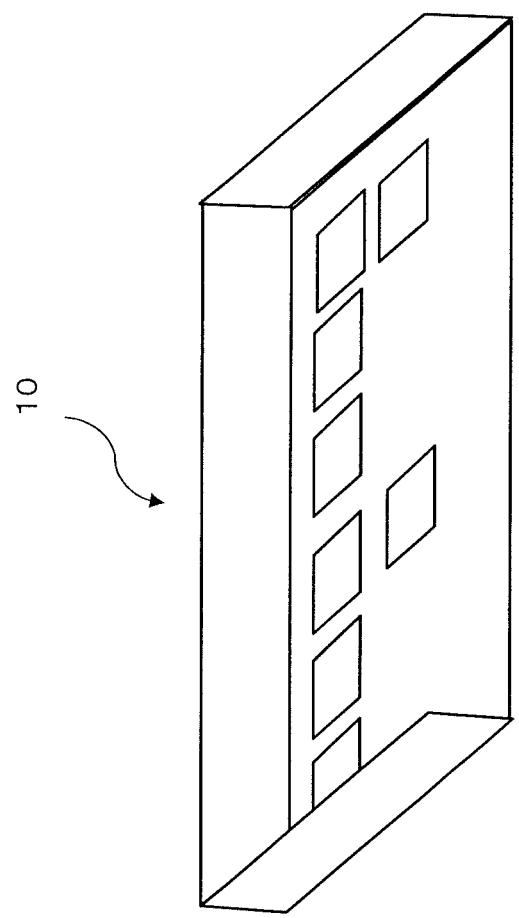
FIG. 1 is a perspective view of a cabinet seen from a back surface side.

FIG. 1 is a view illustrating the cabinet 10 forming a panel substrate seen from a back surface side. On the front surface of this cabinet, switch patterns are displayed by an appropriate means such as printing.

The cabinet 10 is in a casing shape in which a back surface and a front side surface are opened. By covering a base substrate formed by a front side surface and a bottom surface with the cabinet 10 and fixing them together, a touch switch is formed. A circuit board on which an IC and peripheral devices are fabricated is mounted on a front surface of the base substrate, and connection cables or the like are attached to the side surface of the base substrate via an external interface.

Figure 2:
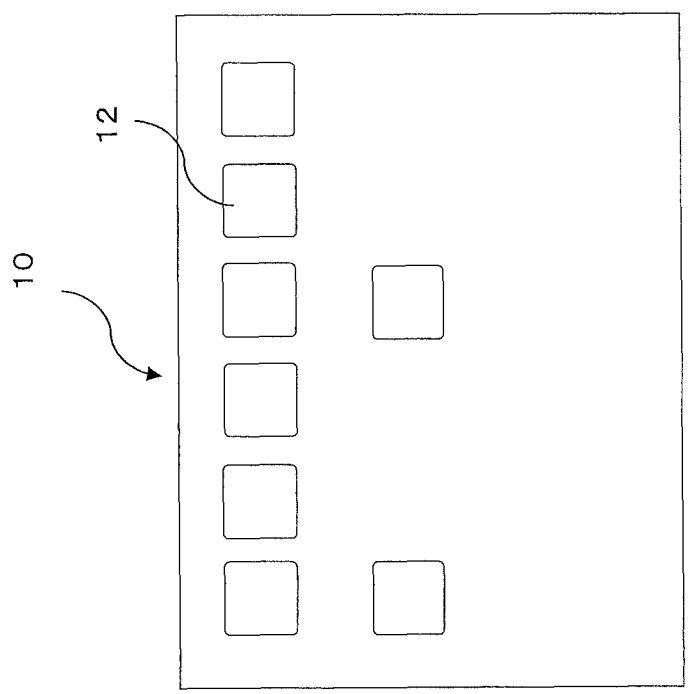
FIG. 2 is view illustrating a front surface of the cabinet.

FIG. 2 illustrates a front surface of the cabinet 10. As illustrated, switch patterns 12 are formed at locations to be touched by a user with a finger. The switch pattern is formed by an arbitrary means such as printing. The cabinet 10 is preferably formed of a resin (dielectric) such as an acrylic agent. The object which touches the switch patterns 12 is not necessarily limited to a finger and may be a pen which can cause an equivalent change in capacitance. Further, it is sufficient that a finger or other objects only come in proximity to the switch pattern.

Figure 3:
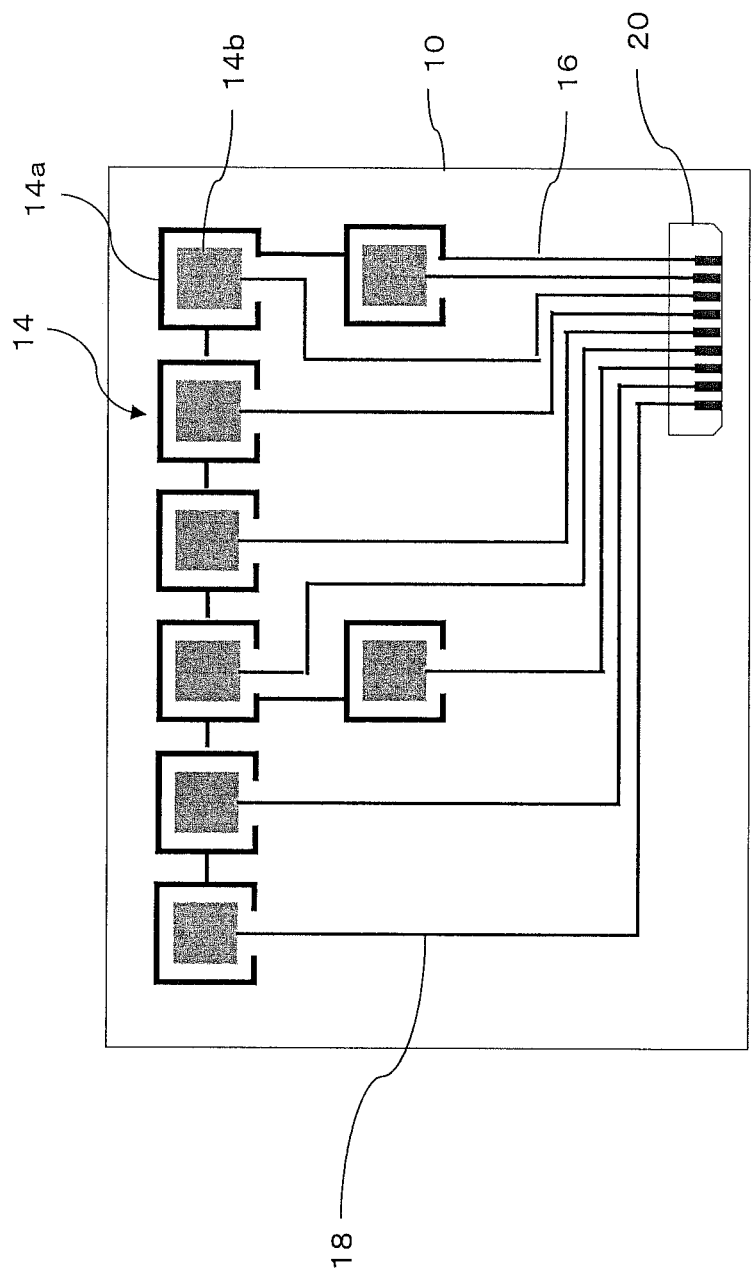
FIG. 3 is view illustrating a back surface of the cabinet.

FIG. 3 illustrates the back surface of the cabinet 10. As illustrated, detection patterns 14 are provided at locations respectively corresponding to the switch patterns 12. The detection patterns 14 are formed on the back surface of the cabinet 10 by using a conductive coating. Each detection pattern 14 is formed of a C drive 14a which is a peripheral pattern and a channel 14b which is an individual pattern. The C drives 14a are connected by a common wiring pattern 16 for connection of the C drive 14a, which is drawn to a connector 20. On the other hand, the channels 14b are individually drawn to the connector 20 by individual wiring patterns 18 for channel 14b.

Here, it is desirable that the detection patterns 14 are formed of a conductive resin, a metal, and the like, in addition to a conductive coating.

Accordingly, the connector 20 includes a single terminal which is connected to the C drives 14a via the wiring pattern 16 and terminals in the number corresponding to the number of the channels 14b, which are connected to the respective channels 14b via the corresponding individual wiring patterns 18.

Figure 4:
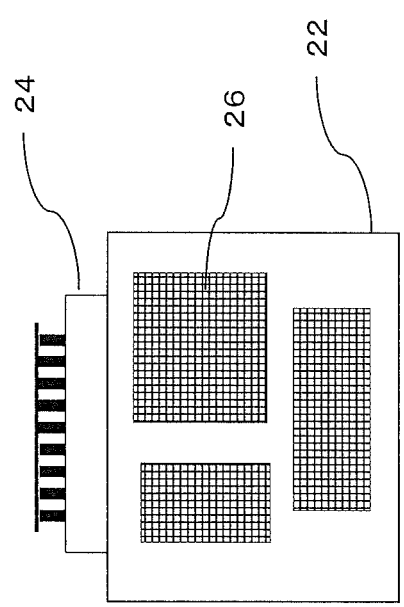
FIG. 4 is view illustrating a circuit board.

The connector 20 is connected to a circuit board 22 as illustrated in FIG. 4 via a flexible wiring and the like. A connector 24 is provided to the circuit board 22 and is connected to the connector 20 via the flexible wiring. On this circuit board 22, a peripheral circuit 26 including IC and so on, for applying a predetermined alternating current between the channel 14b and the C drive 14a of each detection pattern 14 and also detecting a change in capacitance in each detection pattern, is disposed. More specifically, as disclosed in JP 2010-182290 A, a change of capacitance between the channel 14b and the C drive 14a caused by proximity of a finger or the like to the switch patterns 12 is detected by the peripheral circuit 26 on the circuit board 22, so that the peripheral circuit 26 can detect touch of a finger or the like with the switch pattern 12.

Here, as illustrated in FIG. 3, the drawing wiring patterns 16 and 18 to each of the channels 14b and the C drives 14a are arranged so as not to overlap (intersect) each other. It is therefore possible to pattern these conductive patterns (the detection patterns 14 and the wiring patterns 16 and 18) formed of a conductive coating directly on the back surface of the cabinet 10.

The connector 20 illustrated in FIG. 3 can be connected to the wiring patterns 16 and 18 by attaching the connector 20 to the back surface of the cabinet 10 in advance and then applying a conductive coating thereon to thereby form the wiring patterns 16 and 18. More specifically, the connector 20 can be connected to the wiring patterns 16 and 18 by superposing the end portion of the wiring pattern 16 (18) on a terminal portion 20a of the connector 20. Here, it is preferable to apply an insulating protective coating after forming the conductive pattern to form an insulating layer 28, thereby securing isolation among the conductive patterns and preventing leak and migration.

On the other hand, when intersecting the wirings (i.e. when forming cross lines), the conductive patterns can be formed in a multilayer structure, as illustrated in FIG. 6. More specifically, a layered structure of the conductive patterns can be formed by, after forming a first layer wiring 30-1 with a conductive coating, applying a first layer insulating protective coating to form an insulating layer 32-1, further forming a second layer wiring 30-2 with a conductive coating thereon, and finally applying a second layer (top layer) insulating protective coating thereon to form an insulting layer 32-2, for example.

As described above, the conductive patterns described above may be formed by a conductive resin and a metal, in addition to a conductive coating.

FIG. 7 illustrates an example in which the whole cabinet 10 is a metal chassis. In this case, an insulating protective coating is previously applied to the back surface of the cabinet 10 to form an insulating layer. Then, after formation of the insulating layer, portions of the cabinet 10 corresponding to the switch patterns 12 are cut out, so that the metal is removed from the portions corresponding to the switch patterns 12. Accordingly, by further forming the conductive patterns on the back surface of the insulating layer (i.e. a surface of the insulting layer which is exposed by removing the metal), a touch sensor similar to that described above can be formed.

Further, as illustrated in FIG. 7, it is also preferable to cut out only the peripheral portion of the switch pattern 12 to form a switch pattern 34 which is insulated from the cabinet 10. With this structure, the conductive switch pattern 34 as a whole has the same potential, so that the sensitivity of detecting the change in capacitance by the detection patterns 14 can be increased.

Here, conductive coatings with a significantly low resistance are currently available. It is therefore sufficiently possible to detect the change in capacitance by the detection patterns 14 as described above, when the conductive patterns are formed by a conductive coating.

As the cabinet 10 is essential in a touch sensor set, forming the detection patterns 14 on the back side of the cabinet 10 can eliminate the need for providing the detection patterns 14 on a circuit board, so that size of the circuit board can be reduced and therefore significant cost reduction can be achieved concerning the circuit board.

Further, as the detection patterns 14 are directly patterned on the cabinet 10, it is possible to design the cabinet 10 freely, such as forming a curved front surface on the cabinet 10, without design restrictions, contrary to the conventional planar circuit boards.

In addition, by forming the detection patterns 14 on the back surface of the cabinet 10, only the thickness of the cabinet 10 forms an interval between the location which a finger touches and the detection patterns 14 with no air layer being formed therebetween, so that deterioration of the sensitivity can be suppressed as much as possible. In particular, if the cabinet 10 is formed of a dielectric such as an acrylic member, the capacitance can be made sufficiently large so that the detection sensitivity can be increased.

As described above, because no air layers exist and therefore the sensitivity is not lowered, it is also possible to reduce the size of the detection patterns 14 and to use an amplifier with low gain, so that noise resistance can be increased.

Further, it is preferable to form a ground pattern 36 by a conductive coating around the conductive patterns provided on the back surface of the cabinet 10.

Figure 8:
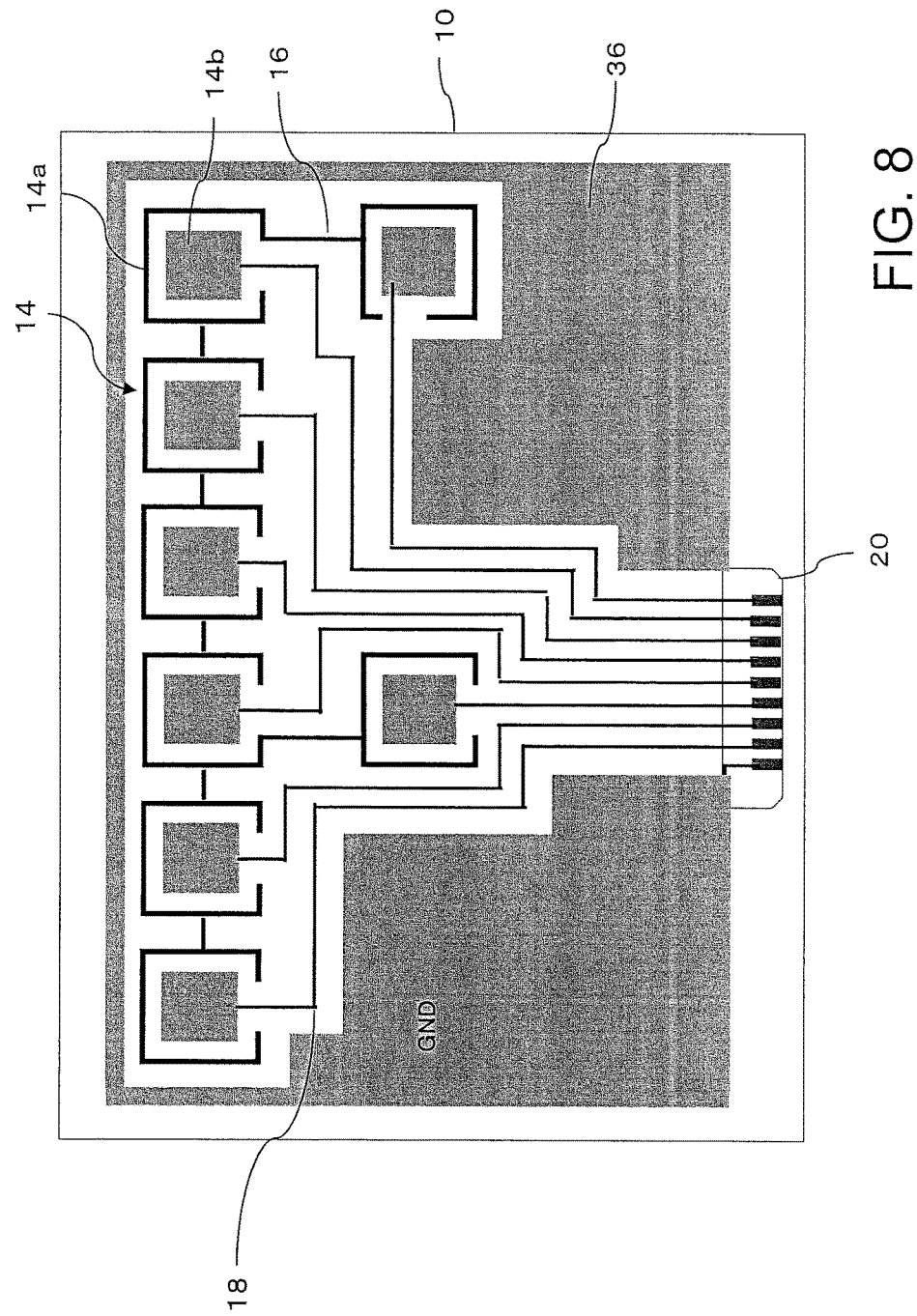
FIG. 8 is a view illustrating a back surface of a cabinet to which a ground pattern is added.

For example, the ground pattern 36 is formed so as to surround the detection patterns 14, as illustrated in FIG. 8. With this structure, it is possible to increase the resistance against noises entering externally and also to suppress discharge of radio waves from the detection pattern 14 side. The ground pattern 36 is connected to the external ground via the connector 20.

Figure 9:
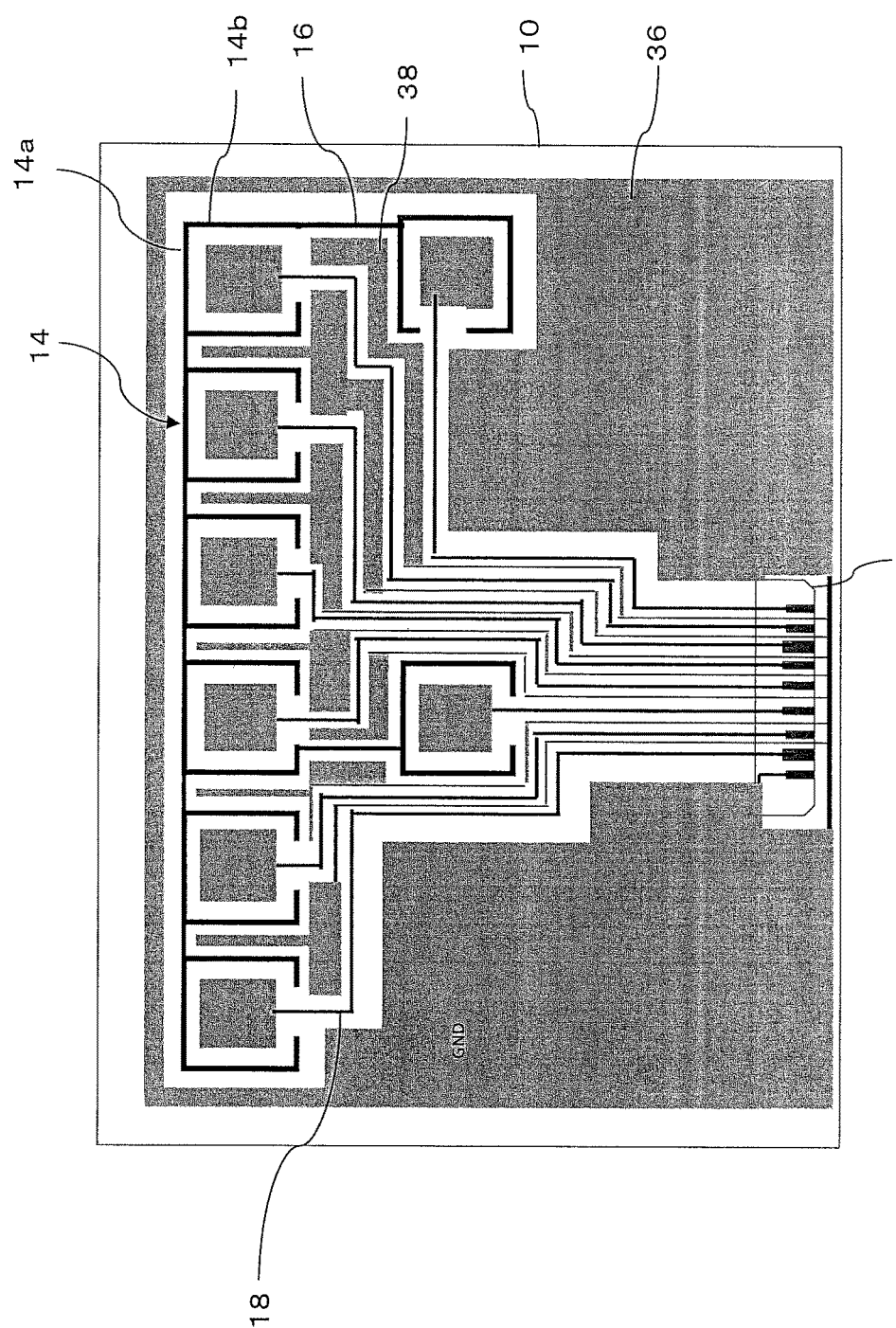
FIG. 9 is a view illustrating another example back surface of a cabinet to which a ground pattern is added.

FIG. 9 illustrates an example in which a ground pattern 38 is further disposed in a space between the wiring patterns 16 and 18, thereby further increasing the noise resistance and so on described above. In this case, the individual ground patterns 38 are separately drawn and connected to the external ground via the connector 20.

Figure 10:
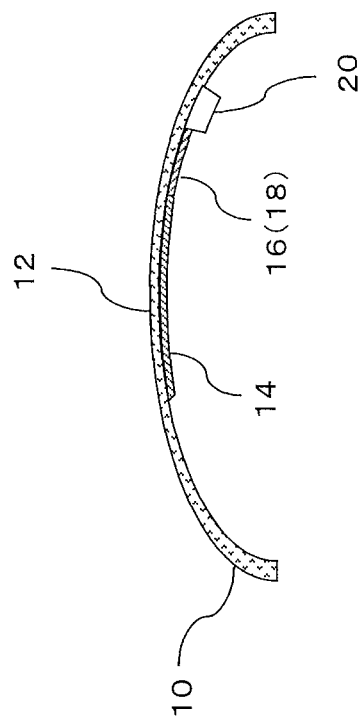
FIG. 10 is a view illustrating another example of the cabinet.

FIG. 10 illustrates an example in which the cabinet 10 has a curved shape and a single detection pattern 14 is provided on a back surface of the cabinet 10.

While in the above description, the location where the detection patterns 14 are disposed has been modified from the conventional devices, as the detection process itself is not particularly different from that in the conventional device, it is not necessary to change the peripheral circuit and the like of the touch sensor nor change the circuit IC or the like.

Further, while the above description relates to a touch switch in which the switch patterns 12 having a switch shape displayed on the front surface of the cabinet 10 are touched with a finger, it is also possible to detect the touch location by decreasing the size of the detection patterns 14 or arranging the detection patterns 14 in a matrix. Accordingly, it is possible to use the touch switch of the present embodiment as a touch panel which detects the touch location and determines processing by associating the detected touch location with screen display, and so on.

While in the above description, the detection patterns are provided on the back surface of the cabinet, it is also possible to allow detection of touch by providing the detection patterns on the front surface side of the cabinet and covering the detection patterns with an insulating film or the like.

While the preferred embodiment of the present invention has been described using specific terms, such description is for illustrative purposes only, and it is to be understood that changes and variations may be made without departing from the spirit or scope of the appended claims.

What is claimed is:

1. A mutual capacitance sensing touch sensor comprising:
a panel substrate having a front surface and a back surface and to which an operation object comes in proximity at the front surface;
a first mutual capacitance sensing detection pattern formed as a conductive pattern over the back surface of the panel substrate for detecting a change in capacitance, the first mutual capacitance sensing detection pattern comprising:
a first capacitance sensing channel;
a capacitive drive structure comprising a first peripheral pattern that has a first portion that is laterally around at least a portion of the first capacitance sensing channel, a second portion extending from a first section of the first peripheral pattern and a third portion extending from a second section of the first peripheral pattern, the third portion of the first peripheral pattern configured for mating with another peripheral pattern, wherein the capacitive drive structure is configured to receive an alternating current signal;
a first wiring pattern having a first end and a second end, the first end electrically connected to the second portion of the first peripheral pattern and the second end of the first wiring pattern electrically coupled to a first portion of a connector;
a second wiring pattern having a first end and a second end, the first end of the second wiring pattern electrically coupled to the first capacitance sensing channel and the second end of the second wiring pattern electrically coupled to a second portion of the connector;
an insulating protective coating formed over the first detection pattern; and
a switch pattern formed directly on the front surface of the panel substrate, the switch pattern at a location on the front surface that corresponds to the location of the first mutual capacitance sensing detection pattern on the back surface.

2. The mutual capacitance sensing touch sensor according to claim 1, wherein the panel substrate forms a cabinet which is an external casing of the mutual capacitance sensing touch sensor.

3. The mutual capacitance sensing touch sensor according to claim 1, further including a drive circuit coupled to the first peripheral pattern and to the first capacitance sensing channel, wherein the drive circuit provides a predetermined alternating current between the first peripheral pattern and the first capacitance sensing channel, and wherein the drive circuit detects a change in capacitance between the first peripheral pattern and the first capacitance sensing channel.

4. A mutual capacitance sensing touch sensor comprising:
a cabinet comprising a dielectric material having a front surface and a back surface and to which an operation object comes in proximity at the front surface;
a first mutual sensing detection pattern which is formed as a conductive pattern on the back surface of the cabinet for detecting a change in capacitance, the first mutual sensing detection pattern comprising:
a first individual sensing pattern having at least first and second opposing sides;
a first peripheral capacitive drive pattern having a first portion, a second portion, and a third portion, wherein the first portion, the second portion, and the third portion are spaced apart from the first individual sensing pattern and the third portion is configured for mating with a second peripheral capacitive drive pattern of a second mutual sensing detection pattern;
a first wiring pattern having a first end and a second end, the first end of the first wiring pattern electrically coupled to the second portion of the first individual sensing pattern;
a second wiring pattern having a first end and a second end, the first end of the second wiring pattern electrically coupled to the first portion of the first peripheral capacitive drive pattern;
the second mutual sensing detection pattern formed as a conductive pattern on a second portion of the back surface of the cabinet for detecting a change in capacitance, the second mutual sensing detection pattern comprising:
a second individual sensing pattern having at least first and second opposing sides;
a second peripheral capacitive drive pattern having a first portion, a second portion, and a third portion, wherein the first portion, the second portion, and the third portion are spaced apart from the second individual sensing pattern;
a third wiring pattern having a first end and a second end, the first end of the third wiring pattern electrically coupled to a first portion of the second individual sensing pattern;
a switch pattern formed directly on the front surface of the cabinet, the switch pattern at locations on the front surface that correspond to the locations of the first mutual sensing detection pattern on the back surface; and a connector configured to be connected to the second end of the first wiring pattern and to the second end of the second wiring pattern.

5. The mutual capacitance sensing touch sensor according to claim 4, wherein a ground pattern is formed in the periphery of the first mutual sensing detection pattern, the ground pattern being also externally connected via the connector.

6. The mutual capacitance sensing touch sensor according to claim 4, further comprising: a conductive pattern for connecting the connector with the first mutual sensing detection pattern.

7. The mutual capacitance sensing touch sensor according to claim 4 further comprising: a substrate board having a drive circuit for driving the first mutual sensing detection pattern, the substrate board being provided independently of the cabinet.

8. The mutual capacitance sensing touch sensor according to claim 7, wherein the substrate board and the first mutual sensing detection pattern are connected with each other via the connector.

9. The mutual capacitance sensing touch sensor according to claim 4, wherein a panel substrate forms the cabinet which is an external casing of the mutual capacitance sensing touch sensor.

10. A mutual capacitance sensing touch sensor comprising:
a cabinet to which an operation object comes in proximity from a front surface side thereof;
a plurality of mutual sensing detection patterns which are formed as conductive patterns directly on a back surface of the cabinet for respectively detecting a change in capacitance independently from each other, the plurality of mutual sensing detection patterns comprises at least a first mutual sensing detection pattern and a second mutual sensing detection pattern, wherein the first mutual sensing detection pattern is provided at a location corresponding to the location of a first switch pattern and comprises:
a first capacitance sensing channel;
a first individual wiring pattern having a first end and a second end, the first end of the first individual wiring pattern coupled to the first capacitance sensing channel;
a first peripheral capacitive drive pattern having a first portion, a second portion, and a third portion, the second portion of the first peripheral capacitive drive pattern configured to be spaced apart from the first capacitance sensing channel, the first portion of the first peripheral capacitive drive pattern extending from the second portion of the first peripheral capacitive drive, and the third portion of the first peripheral capacitive drive pattern extending from the second portion of the first peripheral capacitive drive pattern;
a first common wiring pattern having a first end and a second end, the first end of the first common wiring pattern coupled to the first portion of the first peripheral capacitive drive pattern; and wherein the second mutual sensing detection pattern is provided at a location corresponding to the location of a second switch pattern and comprises:
a second capacitance sensing channel;
a second individual wiring pattern having a first end and a second end, the first end of the second individual wiring pattern coupled to the second capacitance sensing channel;
a second peripheral capacitive drive pattern having a first portion, a second portion, and a third portion, the second portion of the second peripheral capacitive drive pattern configured to be spaced apart from the second capacitance sensing channel, the first portion of the second peripheral capacitive drive pattern extending from the second portion of the second peripheral capacitive drive pattern, and the third portion of the second peripheral capacitive drive pattern extending from the second portion of the second peripheral capacitive drive pattern;
a second common wiring pattern having a first end and a second end, the first end of the second common wiring pattern coupled to the first portion of the second peripheral capacitive drive pattern;
an insulating protective coating formed over the first mutual sensing detection pattern; and
a switch pattern formed directly on the front surface of the cabinet, the switch pattern at a location on the front surface that corresponds to the location of the first mutual sensing detection pattern on the back surface.

11. The mutual capacitance sensing touch sensor according to claim 10, further including a connector having a plurality of terminals individually connected to the plurality of mutual sensing detection patterns.

12. The mutual capacitance sensing touch sensor according to claim 11 wherein a ground pattern is formed in the periphery of the plurality of mutual sensing detection patterns, the ground pattern being also externally connected via the connector.

13. The mutual capacitance sensing touch sensor according to claim 11, wherein a plurality of conductive patterns respectively connecting the plurality of terminals of the connector with the corresponding plurality of mutual sensing detection patterns do not intersect each other.

14. The mutual capacitance sensing touch sensor according to claim 11 further comprising: a substrate board having a drive circuit for driving the plurality of mutual sensing detection patterns.

15. The mutual capacitance sensing touch sensor according to claim 14, wherein, the substrate board and the plurality of mutual sensing detection patterns are connected via the connector.

16. The mutual capacitance sensing touch sensor according to claim 11, wherein the cabinet is an external casing of the mutual capacitance sensing touch sensor.

17. The mutual capacitance sensing touch sensor according to claim 10, wherein the cabinet is an external casing of the mutual capacitance sensing touch sensor.

* * * * *